United States Patent [19]

Claassen et al.

[11] Patent Number: 4,467,433

[45] Date of Patent: Aug. 21, 1984

[54] DEVICE FOR DETERMINING A TRIGGER POINT ON AN ELECTRIC SIGNAL WITH GIVEN AMPLITUDE DISTRIBUTION OVER TIME

[75] Inventors: Peter Claassen, Graz; Heimo Denk, Feldbach; Werner Moser, Graz, all of Austria

[73] Assignee: Hans List, Graz, Austria

[21] Appl. No.: 288,117

[22] Filed: Jul. 29, 1981

[30] Foreign Application Priority Data

Jul. 31, 1980 [AT] Austria .................................. 3988/80

[51] Int. Cl.³ .............................................. G04F 10/00
[52] U.S. Cl. ..................................... 364/481; 377/19; 364/556
[58] Field of Search ............... 364/481, 555, 556, 558; 377/19, 20, 55

[56] References Cited

U.S. PATENT DOCUMENTS 3,955,070  5/1976  Suzuki et al. ..................... 364/558 X
4,080,653  3/1978  Barnes, Jr. et al. ............... 377/19 X
4,288,687  9/1981  Zinn ....................................... 377/19

Primary Examiner—Edward J. Wise
Attorney, Agent, or Firm—Watson Cole Grindle & Watson

[57] ABSTRACT

The device comprises an evaluation unit and at least one transducer for feeding the electric signal to this unit on the occurrence of a characteristic event and the evaluation unit comprises a recognition unit sensing the occurence of the characteristic event. To permit determination of the trigger point characterizing the occurrence of the characteristic event also in the case of heavily noise-contaminated measuring signals the evaluation unit is provided with one or several comparators in addition to the recognition unit, whose thresholds are spaced out over a certain range of levels, and—depending on whether the transducer signal has reached the threshold of the recognition unit—by using the information contained in the evaluation unit, which is influenced by the sequence of the comparator responses according to the signal shape delivered by the transducer, for determination of the trigger point characterizing the occurence of the characteristic event, in a manner predetermined in the evaluation unit.

9 Claims, 7 Drawing Figures

DEVICE FOR DETERMINING A TRIGGER POINT ON AN ELECTRIC SIGNAL WITH GIVEN AMPLITUDE DISTRIBUTION OVER TIME

BACKGROUND OF THE INVENTION

The present invention relates to a device for determining a trigger point of an electric signal with a given amplitude distribution over time, which comprises an evaluation unit and at least one transducer for feeding the electric signal to this unit on the occurrence of a characteristic event, and the evaluation unit comprises a recognition unit sensing the occurence of the characteristic event.

Such devices are intended for evaluating the electric signal delivered by a transducer in such a way as to permit the determination of a trigger point from the signal arriving via the transducer in temporal proximity to the characteristic event. For further purposes of measurement and evaluation, this trigger point is related to the point in time of the occurence of the characteristic event. Depending on the type of the characteristic event to be evaluated and on various external influences on the measuring set-up, the electric signal is characterized by a particular amplitude distribution over time.

DESCRIPTION OF THE PRIOR ART

Devices of the above mentioned type are known from applications in ballistics among others, where they may be used for measuring the expansions of a gun barrel or similar object caused by the rise of internal pressure on firing a shell, and for evaluating the electric measuring signals received on such occasions when using a suitable transducer. During this evaluation the noise-contaminated measuring signal is examined for a certain trigger point which can then be referred to as the "point in time at which the projectile has passed an imaginary measurement plane". The noise in the measurement signal to be evaluated consists of both true noise signals occurring independently of the phenomenon to be measured, and of signals which are caused by the effect to be measured but have no direct bearing on the characteristic event, e.g. pressure waves in the gun barrel running ahead of the projectile.

For recognition purposes, devices of the known type are usually provided with a comparator in the evaluation unit, one input of which is fed with the signal arriving from the transducer while the other one is fed with a reference signal of a known level. When the level of the reference signal has been surpassed by that of the transducer signal, the comparator transmits an output signal for further use which indicates that the desired trigger point has been reached. Usually, the threshold of this comparator used for recognition of the characteristic event is set to a level which is not reached by the above mentioned noise signals. In such cases it will be impossible to place the trigger point e.g. at the base of a pressure slope converted into an electric signal by means of the transducer, as the noise signals cannot be identified as such by the evaluation unit. Since with certain measurement tasks the noise signals may attain even higher levels than the measurement signal proper, devices of the known type will only yield satisfactory results when used with practically noise-free measurement signals, as it is only with amplitude distributions of this type that the threshold of the recognition comparator can be chosen freely.

SUMMARY OF THE INVENTION

It is an object of the present invention to improve a device of the above mentioned type in such a way as to eliminate the afore-mentioned disadvantages and to permit determination of the trigger point characterizing the occurence of the characteristic event also in the case of heavily noise-contaminated measuring signals.

According to the present invention this is achieved by providing the evaluation unit with one or several comparators in addition to the recognition unit, whose thresholds are spaced out over a certain range of levels, and—depending on whether the transducer signal has reached the threshold of the recognition unit—by using the information contained in the evaluation unit, which is influenced by the sequence of the comparator responses according to the signal shape delivered by the transducer, for determination of the trigger point characterizing the occurence of the characteristic event, in a manner predetermined in the evaluation unit. In addition to the recognition unit, the signal which is transmitted to the evaluation unit and which corresponds directly to the occurrence of the characteristic event via the characteristics of the transducer, is thus fed into one or several comparators with different threshold levels. The analog signal arriving from the transducer is practically digitized by the comparators, each sensing signal levels of different heights, with the potential output signals from the comparators, which would indicate that the transducer signal has either surpassed or fallen below the relevant threshold value, exerting a direct influence on the evaluation unit. Depending on whether the transducer signal has reached the threshold value of the recognition unit, the signal shape which is determined by the time sequence of the comparator output pulses, is taken account of in a manner predetermined in the evaluation unit, thus permitting determination of the trigger point of the signal characterizing the occurrence of the characteristic event. In this way the simple arrangement of comparators in the evaluation unit will enable rather complex amplitude distributions over time of an electric signal corresponding to a particular characteristic event to be evaluated in such a way as to obtain in a reproducible manner a trigger point necessary for establishing the point in time of the occurence of the particular characteristic event—independent of the actual signal level that can be measured at this trigger point.

In an enhanced version of this invention the thresholds of the comparators are set to values below the signal level which would trigger the recognition unit. Thus the recognition unit will be the last unit to respond during the build-up of the signal, and will thus be later than the comparators. At the time of response of the recognition unit, the sampling of the signal which is necessary for determination of the trigger point, will therefore have been completed, and direct conclusions can be drawn on the trigger point of the signal characterizing the occurrence of the characteristic event via the information in the evaluation unit concerning the output signals from the comparators.

Another proposal of the present invention is concerned with placing one or several counters in the evaluation unit, whose input(s) can be fed with signals derived from temporal or spatial (clock pulses) during the period between a gating signal and the occurrence of the output pulse of the recognition unit; depending on the time sequence of the output signals of the comparators, such a counter can be set, started or read by at least one of the comparators during this period, the counting process being terminated on response of the recognition unit. This arrangement of the counter, which can be influenced depending on the output signals from the comparators reflecting the amplitude distribution of the transducer signal over time, allows for a simple way of directly using the information contained in the counter for determining the trigger point of the signal after the recognition unit has responded.

If the newly designed device is used e.g. for measuring applications in ballistics, it will be easily possible to determine a trigger point, e.g. when firing a projectile, from the electric signal which is generated by a suitable transducer located on the barrel, and which is characterized by a given amplitude distribution over time. For all further evaluations this trigger point may be referred to as the point in time of the passing of the projectile. This will permit measuring the projectile velocities from two trigger points or points in time obtained in this manner.

As is suggested in another modification of this invention, it will be of particular advantage in this context if the evaluation unit can be fed an additional reference signal triggered by temporal or spatial processes (clock pulses), and if the evaluation unit is used for processing the responses of the comparators and for determining the trigger point by means of establishing a temporal or spatial distance from the occurrence of the reference signal. The trigger point of the first measurement obtained with this type of device may therefore be used as a direct reference signal for a second measurement of this kind which is obtained at a given distance, thus permitting direct measuring of projectile velocities.

Another application in which the invention can be used to great advantage would be the determination of the rotation angle of an engine shaft, where it is essential to precisely determine the relative rotation angle between a reference position and the shaft position coinciding with the occurrence of an event caused by a function of the engine. For the development, design and monitoring of injection engines e.g. it is of great interest to know the exact time of fuel injection or fuel feed relative to the upper dead center of the piston; in the simplest case, this information can be obtained by measuring the rotation angle of the crankshaft or camshaft from upper dead center as a reference position, up to the beginning of injection or fuel feed. The beginning of fuel injection or fuel feed may be determined by means of the pressure in the fuel line or its changes and by the use of a transducer converting such pressure changes into an electric signal. Due to the fact that pressure changes are converted into electric signals via deformations of the fuel pipe, however, the easy-to-use clamp-on transducers which are normally used for such purposes suffer from marked noise contamination of the signal proper corresponding to the fuel feed, which is a serious obstacle to the proper evaluation of the measuring signal. Partly, this noise results from leading pressure waves causing premature injection, and partly it can be traced back to actual disturbances of a mechanical or electric nature, which can be visually identified as such, e.g. by means of an oscilloscope. If a trigger point—e.g. for the beginning of fuel injection—is to be determined from the amplitude distribution over time as given by the transducer, the device as specified by the invention will permit that the actual signal shape is taken account of via the influence exerted by the output signals of the comparators on the evaluation unit such that the trigger point of the signal characterizing the occurrence of the characteristic event can be determined retrospectively. The reference signal which is generated at the reference position and fed to the evaluation unit, permits direct and simple determination of the time interval or angular distance between the trigger point and the reference point, thus immediately solving the measurement problem. Given a signal with a predetermined distribution of the amplitude over time, a device designed according to the invention will permit in a simple manner to weight or cut out high-level noise, thereby enabling an unambiguous trigger point to be established at any amplitude level of the signal chosen.

DESCRIPTION OF THE DRAWINGS

Following is a more detailed description of various exemplary embodiments of the invention and their respective advantages, as illustrated by the enclosed drawings, wherein.

DESCRIPTION OF THE PREFERRED EMBODIMENTS

Figure 1:
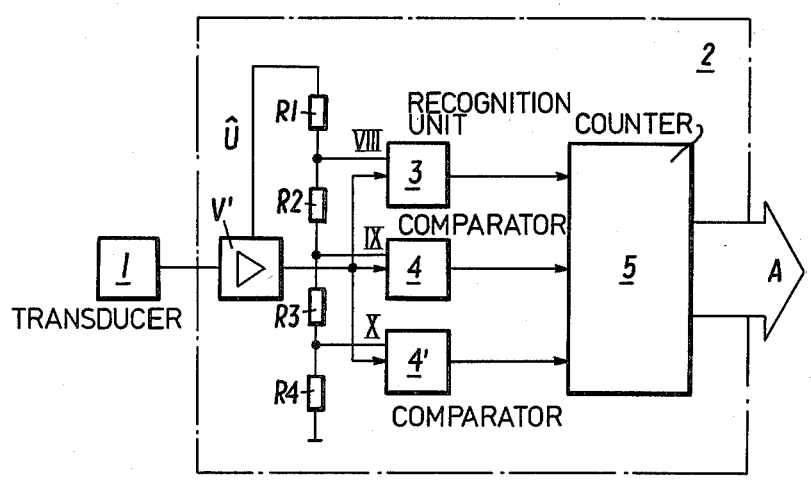
FIG. 1 is a block diagramm of a device designed according to the present invention.

In FIG. 1, the device for determining the trigger point of an electric signal with a given amplitude distribution over time basically consists of a transducer 1 transmitting the electric signal to be evaluated on the occurrence of a characteristic event, and of an evaluation unit 2, which comprises a recognition unit 3 for sensing the occurence of the characteristic event and is connected to the transducer 1 via an appropriate signal line. In the quoted example the evaluation unit 2 contains two comparators 4, 4' in addition to the recognition unit 3, whose functions are analogous to that of the recognition unit 3 and which are represented, for example, by commonly known comparator units. One input of the recognition unit 3 and of the two comparators 4, 4' is fed the transducer signal via the amplifier V', while the other input of units 3, 4, 4' receives a reference signal which is generated by way of a reference voltage Ū and the series-connected resistors R1, R2, R3, R4 in this embodiment. As the magnitude of the reference voltage for units 3, 4, 4' which is derived from the connecting points between the individual resistors, is graded in correspondence with the resistor values, this will result in graded thresholds such that the rising transducer signal will trigger first comparator 4', then comparator 4 and finally the recognition unit 3. In this context, "triggering" means that the signal level delivered by the transducer 1 and the amplifying unit V' will reach the level of the respective threshold, marked by VIII, IX, X thus inducing the recognition unit 3 and the comparators 4, 4' to generate an appropriate output signal.

The output signals generated by the comparators 4, 4' are fed into a counter 5 which is also connected to the output of the recognition unit 3. Depending on whether the transducer signal has reached the threshold VIII of the recognition unit 3, the information contained in the evaluation unit 2 and in counter 5, which is influenced by the response sequence of the comparators 4, 4' in accordance with the signal shape delivered by the transducer 1, serves—in a way predetermined in the evaluation unit 2—for determination of the trigger point of the signal characterizing the occurrence of the characteristic event, and may be put to further use, e.g. via an output A.

Figure 2:
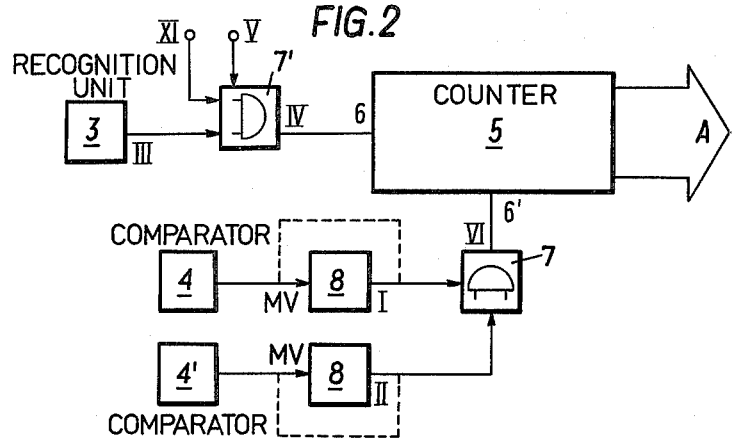
FIGS. 2, 6, 7 are block diagrams of other modified embodiments.

The embodiment represented by FIG. 2 includes a counter 5 which has a zero-setting input 6' in addition to a counting input 6. The counting input 6 of the counting device 5 is fed counting pulses IV which are obtained from a continuous pulse train XI (clock pulses) corresponding to temporal or spatial processes, via a gating circuit 7' - cf. FIGS. 3 to 5. On the occurrence of a gating signal V (cf. FIGS. 3 to 5) at the beginning of measuring, the gating circuit 7' permits feeding the pulse train XI or clock pulses into counting input 6, until the recognition signal III is delivered by the recognition unit 3. In this embodiment (FIG.2) each of the output signals I, II of the comparators 4, 4' is connected to a selection logic circuit 7 either via a monostable multivibrator 8 or, as indicated by the broken line, directly. Depending on the time sequence of the output signals I, II registered, the selection logic circuit 7 utilizes at least one of the comparators 4, 4' for resetting the counter 5 via a signal VI connected to the zero-setting input 6'.

In FIG. 2, the recognition device 3 and the comparators 4, 4' are connected to a transducer in a manner not shown, which may resemble that of FIG. 1, and are fed threshold signals of different levels, thereby generating the respective threshold values. Basically, the invention would also permit the entire evaluation unit or parts thereof to be designed as an integrated circuit, or to delegate at least part of the evaluation function to a suitably wired or programmed microprocessor. Moreover, a software realization of at least parts of the evaluation unit is conceivable.

Figure 7:
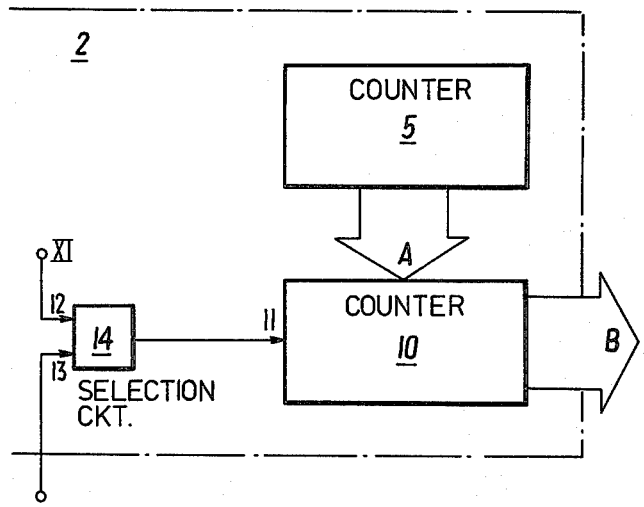

FIG. 7 is concerned with another embodiment of the invention and shows that the trigger point of an electric signal with a given amplitude distribution over time which is provided by the evaluation unit 2, can be additionally brought in relation to a reference signal 13. In this case the information contained in the first counter 5 at the time of the recognition unit's response is transmitted from output A into another counter 10, while the clock pulses XI corresponding to temporal or spatial processes are being continued to be counted until the occurrence of the reference signal 13 via selection circuit 14. The count contained in counter 10 at the time of the occurrence of the reference signal is marked "B" and corresponds directly to the time interval or distance in pulse units between the trigger point and the reference signal.

Figure 4:
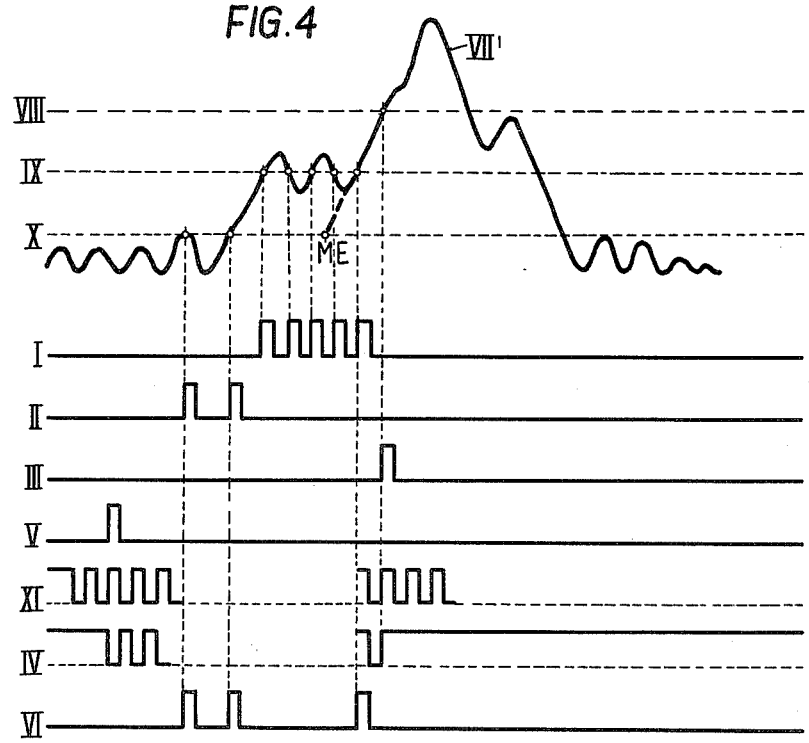
Figure 5:
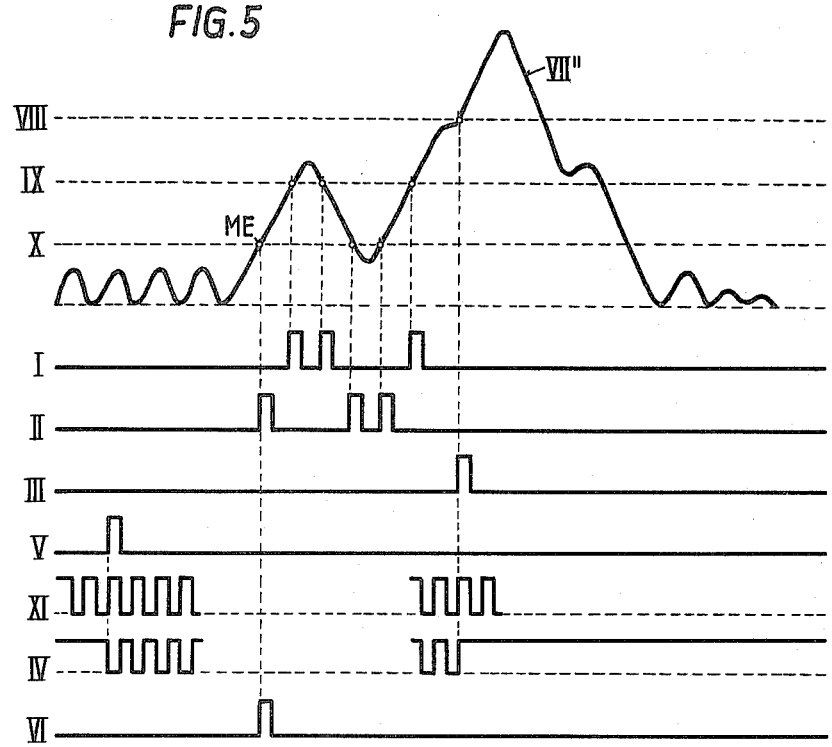

A detailed explanation of the function of the device as specified by the invention is given below, using the pulse trains shown in FIGS. 3, 4, 5 as an example.

Figure 3:
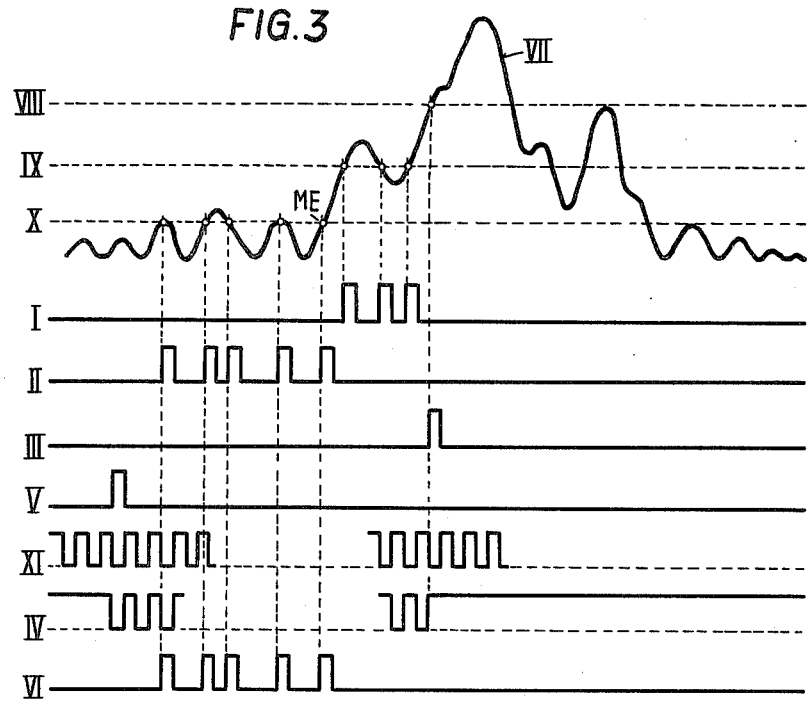
FIGS. 3, 4, 5 represent distributions of amplitudes over time of the signals occurring at different places in the different design modifications of the present invention.

The electric signal marked VII in FIG. 3 is characterized by an amplitude distribution over time which is typical e.g. of the pressure as a function of time in a fuel feed or fuel injection line of a combustion engine, as measured by a piezoelectric transducer clamped onto the line. For determination of a characteristic event from the shape of curve VII—in this context e.g. the beginning of fuel feed of the injection pump—it will be necessary to obtain an unambiguous trigger point for further evaluation, which can be utilized for determining the time interval or angular distance between the beginning of fuel feed and the upper dead center of the piston. Since signal VII has a relatively complicated amplitude distribution over time due to various disturbances—premature injection or electrical or mechanical noise in the line itself—it will be somewhat difficult to place the desired trigger point of the signal, which is marked as ME in this drawing, at the proper beginning of the pressure rise in the line which is indicative of the beginning of fuel feed. This problem can be eliminated by roughly digitizing the analog signal VII via the recognition units and comparators discussed under FIGS. 1 and 2, and by using the information contents of the evaluation unit, which is influenced by the comparator output signals generated in this way, for determination of the position of ME.

The threshold value of the recognition unit (3 in FIGS. 1 and 2) is marked VIII, while the thresholds of the comparators (4, 4' in FIG. 1) are numbered IX and X, with the levels of IX and X, which differ by a predetermined amount, being lower than that of VIII. In a tried-out version of the invention these signal levels are placed such that VIII is at 55%, IX at 33% and X at 11% of the maximum signal level, but they may also be graded in a different way without any special impact on the function of the device under discussion.

The pulse trains I, II, III correspond to the output signals transmitted by the comparators or the recognition unit whenever their thresholds are crossed from above or below.

At the beginning of the measuring process a gating signal V (FIG. 3) is used to apply a continuous pulse train or clock pulses XI to the counting input of the counter discussed under FIG. 2. The pulse train XI will influence the count of the counting unit according to its pulse sequence determined by temporal or spatial processes. It will remain at the respective counting input until the counting process is interrupted by a reco9nition signal III, which is delivered by the recognition unit and indicates that the threshold VIII has been crossed. In the embodiment discussed with respect to FIG. 3, any crossing from above or below of the threshold X during this interval, or rather the output signals of the comparator with the lowest threshold derived from this crossing, will apply a signal VI to the zero-setting input of the counter and will thus reset this unit. This will ensure that the count in the counter corresponding to the number of clock pulses XI counted since the last zero-setting, is proportional to the time interval or distance by pulse units between the occurence of the recognition signal and the last crossing of the lowest threshold X, if threshold VIII is crossed, i.e. if the recognition signal III occurs. By proper selection of the threshold X, this value X—as is shown in FIG. 3—can be directly set at the signal level corresponding to the pressure prevailing at the beginning of fuel feed, which means that the trigger point ME can be immediately obtained from the count in the counter as soon as the recognition signal III is given.

The signals I and II arriving after the recognition signal III and before the next gating signal V, may be electronically suppressed in a manner which will not be further discussed here.

Figure 6:
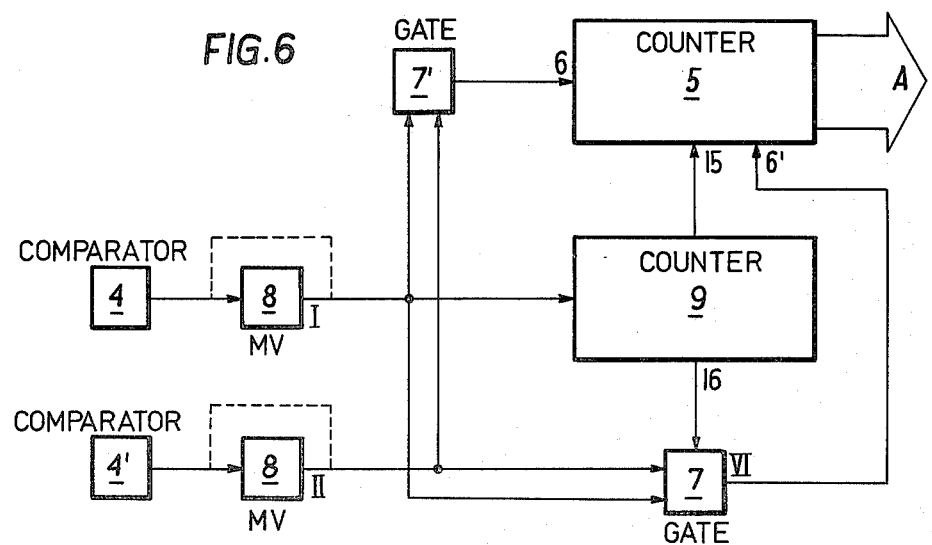

In case of the amplitude distribution over time VII' according to FIG. 4, which again corresponds to a pressure signal in an injection line converted via a piezoelectric clamp-on transducer, a different kind of "disturbance" occurs, which would lead to inaccurate or faulty results if the trigger point ME were determined in the manner discussed under FIG. 3. Therefore an evaluation unit is provided which contains yet another counter 9 (cf. FIG. 6), which may influence the count in counter 5 via an input 15 and will thus enable the trigger point ME to be determined retrospectively in this case. In addition to a crossing of threshold X, a crossing of threshold IX—which will have to be between thresholds VIII and X but may otherwise be adjusted according to the expected amplitude distribution VII'—may produce a zero-setting signal VI at the zero-setting input 6' of counter 5. Via an output 16, the additional counter 9 will control how many crossings of the threshold IX can be tolerated before counter 5 is reset to zero. The remaining processes, e.g. start of counting the pulse train XI via gating signal V and end of counting on transmission of the recognition signal III corresponding to threshold VIII of the recognition unit, are identical to those discussed under FIG. 3. The location of the trigger point ME is determined—as indicated by the broken line in FIG. 4—by extrapolating the distance between the recognition signal and the last zero-setting signal, which can be read from the count at the time of the occurence of recognition signal III, taking into account the known differences in the levels of thresholds VIII, IX and X. In the simplest case, this can be achieved by multiplying the count in counter 5 by that of counter 9. The amplitude distribution over time of an electric signal VII" corresponding to the pressure distribution measured, which is shown in FIG. 5 and is again related to measuring the beginning of fuel feed of a fuel injection combustion engine, illustrates another possibility of determining a suitable trigger point with the device as specified by the present invention. The amplitude distribution over time of the signal VII" shows a marked hump preceding the pressure rise proper as the result of a premature injection, which according to current practice is interpreted as the beginning of fuel feed from the injection pump. In such cases, the evaluation unit (not shown here) is designed such that the output signal II of the comparator with the lowest threshold X will not lead to a reset of the counter, i.e. to a zero-setting signal VI, if the comparator with the higher threshold IX responds before arrival of the last response from the above unit. This will ensure that the count in the counter and the information contained in the evaluation unit correspond to the time interval or distance by pulse units between the occurrence of the recognition signal III and the desired trigger point ME. For the remaining pulse trains the same applies as under FIGS. 3 and 4.

Thus the device designed according to the present invention will permit unambiguous reconstruction of the trigger point for further evaluation even for amplitude distributions over time including noise whose levels are above the signal level at the desired trigger point.

The evaluation unit may be provided with several additional comparators which will further improve the information on and compensation of noise contamination, and will thus lead to an even greater precision in the determination of the trigger point.

I claim:

1. A device for determining a characteristic point in time in an electrical signal with a given amplitude distribution vs. time, the electrical signal representing the occurrence of a characteristic event, comprising:

at least one transducer for generating the electrical signal upon the occurrence of the characteristic event;

an evaluation unit responsive to said electrical signal for sensing the occurrence of said characteristic event, and including a number of comparators responsive to said electrical signal and each having respectively different threshold response levels, said threshold levels extending over a specified range of amplitude levels, each said comparator generating a signal pulse upon said electrical signal exceeding the threshold level thereof;

said evaluation unit including a recognition unit having a higher threshold level than each of said comparators and generating a control signal upon said electrical signal exceeding said higher threshold level;

means for counting clock pulses;

means for gating said clock pulses to said means for counting and controlled by said control signal to close said gate and terminate the counting of said clock pulses; and selection circuitry responsive to the individual signal pulses of said comparators to control the resetting and storing operation of said means for counting.

2. A device according to claim 1 wherein said evaluation unit further includes second means controlled by the occurrence of said control signal for counting said clock pulses, and being connected to a read output of said first counting means to stop counting at the count read out from said first counting means, and further comprising additional selection circuitry for gating said input signals to said second means for counting and terminating said gating in accordance with a specified reference signal.

3. A device according to claim 1 further comprising a number of monostable multivibrators respectively responsive to the signal pulses of said comparators and being connected to said selection circuitry for resetting said means for counting.

4. A device according to claim 3 wherein the last triggering of the comparator having the lowest threshold value by said electrical signal before the generation of said control signal by said recognition unit corresponds to said characteristic point in time.

5. A device according to claim 1 or 4 wherein one of said comparators has a threshold between the lowest threshold level of the other comparators and the threshold level of said recognition unit and that comparator controls the resetting of said means for counting such that said characteristic point in time is determined by arithmetical weighting of the information stored in said means for counting.

6. A device according to claim 5 wherein the signal pulse from that comparator having the lowest threshold does not control operation of said means for counting with at least one of any of the remaining comparators having a higher threshold level generating a signal pulse prior to the generation of said signal pulse from said comparator having the lowest threshold level.

7. A device according to claim 1 further comprising means responsive to said control signal for terminating the comparator signal pulses, and said evaluation unit further including means for generating a gating signal to condition each of said comparators thereby enabling signal pulses therefrom.

8. A device according to any one of claims 1, 3, 4 or 7 further comprising a second means for counting signal pulses of one of said comparators having a threshold level between the lowest threshold level and the threshold level of said recognition unit, said second means for counting producing a reset pulse upon the count stored therein reaching a predetermined value, and wherein said means for counting is reset by said reset pulse.

9. A device according to claim 1 further comprising additional means for gating a reference signal to said evaluation unit, and said characteristic event is determined by said evaluation unit with respect to said reference signal.

* * * * *

UNITED STATES PATENT AND TRADEMARK OFFICE
CERTIFICATE OF CORRECTION

PATENT NO.   :   4,467,433

DATED        :   August 21, 1984

INVENTOR(S) :   Claassen et al

It is certified that error appears in the above-identified patent and that said Letters Patent is hereby corrected as shown below:

Claim 2:   Line 30 of Column 8, cancel "stop" and insert --start--.

Signed and Sealed this

Twelfth Day of February 1985

[SEAL]

Attest:

DONALD J. QUIGG

Attesting Officer

Acting Commissioner of Patents and Trademarks